(12) United States Patent
Lim et al.

(10) Patent No.: US 11,777,248 B2
(45) Date of Patent: Oct. 3, 2023

(54) ELECTRONIC ASSEMBLY AND METHOD OF PRODUCING THE SAME

(71) Applicant: Continental Automotive GmbH, Hannover (DE)

(72) Inventors: Kok Hee Abel Lim, Singapore (SG); Kwang Leong Terence Wong, Singapore (SG); Lay Choo Tichelle Ong, Singapore (SG)

(73) Assignee: CONTINENTAL AUTOMOTIVE GMBH, Hannover (DE)

( * ) Notice: Subject to any disclaimer, the term of this patent is extended or adjusted under 35 U.S.C. 154(b) by 49 days.

(21) Appl. No.: 17/524,092

(22) Filed: Nov. 11, 2021

(65) Prior Publication Data
US 2022/0149561 A1    May 12, 2022

(30) Foreign Application Priority Data
Nov. 12, 2020    (GB) ................................. 2017839

(51) Int. Cl.
*H01R 13/516*    (2006.01)
*H01R 43/18*    (2006.01)

(52) U.S. Cl.
CPC ........... *H01R 13/516* (2013.01); *H01R 43/18* (2013.01)

(58) Field of Classification Search
CPC .............................. H01R 13/516; H01R 43/18
USPC ........................................................ 439/625
See application file for complete search history.

(56) References Cited

U.S. PATENT DOCUMENTS

| | | | | |
|---|---|---|---|---|
| 4,986,779 A | * | 1/1991 | Ferrill .................. | H01R 13/516 439/535 |
| 10,383,253 B1 | * | 8/2019 | Mujcinovic ........ | H05K 7/20409 |
| 11,424,053 B1 | * | 8/2022 | Kim .................... | H01B 17/305 |
| 2003/0015350 A1 | * | 1/2003 | Kim ...................... | H05K 5/066 174/262 |
| 2003/0085291 A1 | * | 5/2003 | Morrow ............... | H05K 5/0247 236/46 R |
| 2005/0083649 A1 | * | 4/2005 | Behrens ............... | H05K 9/0018 361/679.48 |

(Continued)

FOREIGN PATENT DOCUMENTS

CN    205017726 U    2/2016
DE    202007005168 U1    8/2008

(Continued)

OTHER PUBLICATIONS

Japanese Notice of Reasons for Refusal for Japanese Application No. 2021-183280, dated Dec. 8, 2022 with translation, 6 pages.

(Continued)

*Primary Examiner* — Alexander Gilman
(74) *Attorney, Agent, or Firm* — RatnerPrestia

(57) ABSTRACT

An electronic assembly including: a housing for enclosing electronic components within. The housing includes an opening; an input-output port for allowing connection of at least one of the electronic components with at least one input-output device. The input-output port extends through the opening; and a flexibly resilient material integrated with the housing and arranged to partially cover the opening. The flexibly resilient material being dimensioned to complement the dimensions of the input-output port. Also provided is a method of producing the electronic assembly.

12 Claims, 2 Drawing Sheets

(56) References Cited

U.S. PATENT DOCUMENTS

| | | | |
|---|---|---|---|
| 2009/0257626 A1* | 10/2009 | Sherlock | H05K 1/028 |
| | | | 382/126 |
| 2011/0083897 A1* | 4/2011 | Paterek | H01R 13/521 |
| | | | 174/667 |
| 2011/0102967 A1* | 5/2011 | Munns | A61N 1/3754 |
| | | | 361/302 |
| 2014/0115822 A1 | 5/2014 | Shishido et al. | |
| 2014/0272457 A1* | 9/2014 | Watada | C22C 14/00 |
| | | | 428/450 |
| 2015/0171606 A1* | 6/2015 | Wondrak | H05K 5/069 |
| | | | 174/665 |
| 2015/0282335 A1* | 10/2015 | Biegner | B60C 23/0486 |
| | | | 361/752 |
| 2016/0205798 A1* | 7/2016 | Eamon | H05K 5/069 |
| | | | 361/752 |
| 2018/0124940 A1 | 5/2018 | Naono | |
| 2018/0352120 A1* | 12/2018 | Zurowski | H05K 1/189 |
| 2018/0358738 A1* | 12/2018 | Janse | H01R 13/504 |
| 2020/0358276 A1* | 11/2020 | Schonfeld | H02G 15/013 |
| 2020/0413554 A1* | 12/2020 | Penney | H01B 3/441 |
| 2021/0066847 A1* | 3/2021 | Tanimura | H01R 13/5219 |
| 2021/0168231 A1* | 6/2021 | Baker | H05K 5/0086 |
| 2022/0149561 A1* | 5/2022 | Lim | H01R 43/18 |
| 2022/0248553 A1* | 8/2022 | Len | H01L 23/057 |

FOREIGN PATENT DOCUMENTS

| | | |
|---|---|---|
| FR | 3015855 A1 | 6/2015 |
| JP | 08168119 A | 6/1996 |
| JP | 2013026112 A | 2/2013 |
| JP | 2014187099 A | 10/2014 |

OTHER PUBLICATIONS

Great Britain Search Report for Application No. 2017839.8, dated Apr. 29, 2021, 1 page.
Extended European Search Report for European Application No. 21 207 934.7, dated Apr. 8, 2022, 9 pages.

* cited by examiner

ELECTRONIC ASSEMBLY AND METHOD OF PRODUCING THE SAME

CROSS REFERENCE TO RELATED APPLICATIONS

This application claims priority to Great Britain Patent Application No. 2017839.8, filed Nov. 12, 2020, the contents of such application being incorporated by reference herein.

FIELD OF THE INVENTION

The invention relates to an electronic assembly and a method of producing the electronic assembly.

BACKGROUND OF THE INVENTION

Electronic devices typically have ports to connect the electronic device to other devices, such as headphones, mice, cables, and other types of devices or connectors. Such ports are typically assembled with a housing that accommodates the port.

During the assembly process, housings for electronic devices are typically produced with ample clearances to accommodate the ports. However, such clearance gaps cannot be too fitting. Otherwise, there may be issues during assembling of the ports with the housing. On the other hand, providing too large of a clearance gap allows water and other foreign objects to enter the housing, potentially damaging the electronic device within.

A known method is to provide barriers, like ribs or walls, to block entry of water or foreign objects into any opening, such as an opening for connectors. However, such barriers suffer from the disadvantage outlined above. That is, the barriers must be provided with enough clearance to avoid hitting and damaging the connectors during assembly, yet with a small enough clearance to prevent water and foreign objects from easily entering the electronic device.

Another known method is to use a rubber gasket to wrap around the connectors, thereby closing any gap between the connectors and the housing. However, secondary processes will be needed to assemble the gasket to the connectors and/or housing, which would incur additional production costs.

Yet another known method is to over-mold rubber onto the housing. However, because rubber is typically injected after the injection molding of the housing, it is a challenge to find a location on the molding machine for a gate to introduce the rubber. Furthermore, the tonnage of the molding machine will be doubled due to the additional mold for the rubber over-molding steps. Hence, such method incurs additional machinery costs and design costs.

There is therefore a need to provide an improved electronic assembly and production method that overcome or at least ameliorate one or more of the disadvantages discussed above and other disadvantages.

SUMMARY OF THE INVENTION

An aspect of the invention is an electronic assembly and production method to address the problems discussed above.

To accomplish this and other aspects, there is provided, in an aspect, an electronic assembly comprising: a housing for enclosing electronic components within, wherein the housing comprises an opening; an input-output port for allowing connection of at least one of the electronic components with at least one input-output device, wherein the input-output port extends through the opening; and a flexibly resilient material integrated with the housing and arranged to partially cover the opening, the flexibly resilient material being dimensioned to complement the dimensions of the input-output port.

In another aspect, there is provided a method of producing an electronic assembly as disclosed herein, the method comprising: providing a mold for producing a housing for the electronic assembly, wherein the mold comprises a section to allow an opening to be formed in the housing, and wherein the section is sized such that the opening allows an input-output port to extend through the opening; mounting a flexibly resilient material on said section of the mold such that the flexibly resilient material will partially cover said opening once formed, wherein the flexibly resilient material is dimensioned to complement the dimensions of the input-output port; introducing molten material into the mold and solidifying the molten material to produce the housing comprising the flexibly resilient material integrated with the housing; securing the housing with a substrate comprising the input-output port connected thereto to produce the electronic assembly.

Advantageously, the use of a flexibly resilient material reduces or eliminates any damages to the input-output port during production. The disclosed material being flexibly resilient provides flexibility to absorb any misalignment during assembling of the electronic assembly. Within the scope of the present disclosure, a material may be defined as "flexibly resilient" if the material has:
- a Tensile Modulus below 50 MPa (ASTM D638, 23C, 50 mm/min), preferably below 30 MPa, particularly preferred in the range of 15 to 1 MPa, and/or
- a Tensile Yield Elongation over 50% (ASTM D638, 23C, 50 mm/min, preferably over 100%, particularly preferred in the range of 70 to 150%, and/or
- a Shore A Hardness (ASTM D2240, 23C, 0 sec) below 150, preferably below 90, particularly preferred in the range of 5 to 50.

Further advantageously, the disclosed flexibly resilient material, being dimensioned to complement the dimensions of the input-output port, reduces any gaps between the housing and the input-output port caused by the opening. The flexibly resilient material may be dimensioned to cover any space made by the opening that is not taken up by the input-output port. Due to the complementary dimensions, the flexibly resilient material and the input-output port cooperate to cover the opening. Water, dirt and other foreign objects may advantageously be prevented from entering the electronic assembly. Damage to the electronic components within the housing caused by foreign objects entering the electronic assembly through the opening in the housing may advantageously be eliminated or reduced.

Compared to protective coverings designed to be punctured to expose an opening, the disclosed solution is advantageously simpler, with no need for a specialized tool or device to guide an element to puncture such protective covering. The disclosed solution uses less material than such protective coverings. The integrity of the disclosed flexibly resilient material is advantageously not compromised by any puncturing or piercing.

The disclosed flexibly resilient material may be integrated with the housing during or contemporaneous with the formation of housing. Thus, the disclosed solution does not suffer from additional production costs in order to conceal the opening for the input-output port. The disclosed solution does not suffer from additional production costs in order to provide a covering for the opening for the input-output port. The housing may be formed by extrusion. The housing may be formed by injection molding. The housing may be a plastic housing. The flexibly resilient material may be integrated with the housing by injection molding. The housing comprising the flexibly resilient material integrated therewith may be formed by injection molding.

BRIEF DESCRIPTION OF THE DRAWINGS

In the figures, like numerals denote like parts.

DETAILED DESCRIPTION OF EXEMPLARY EMBODIMENTS OF THE INVENTION

Hereinafter, exemplary embodiments of the present invention will be described in detail with reference to the accompanying drawings. The detailed description of exemplary embodiments of this invention will be provided for the purpose of explaining the principles of the invention and its practical application, thereby enabling a person skilled in the art to understand the invention for various exemplary embodiments and with various modifications as are suited to the particular use contemplated. The detailed description is not intended to be exhaustive or to limit aspects of the invention to the precise embodiments disclosed. Modifications and equivalents will be apparent to practitioners skilled in this art and are encompassed within the spirit and scope of the appended claims.

In an embodiment, there is provided an electronic assembly. The electronic assembly comprises: a housing for enclosing electronic components within; an input-output port for allowing connection of at least one of the electronic components with at least one input-output device; and a flexibly resilient material integrated with the housing. The housing comprises an opening, through which the input-output port extends. The flexibly resilient material is arranged to partially cover the opening and is dimensioned to complement the dimensions of the input-output port.

Figure 1:
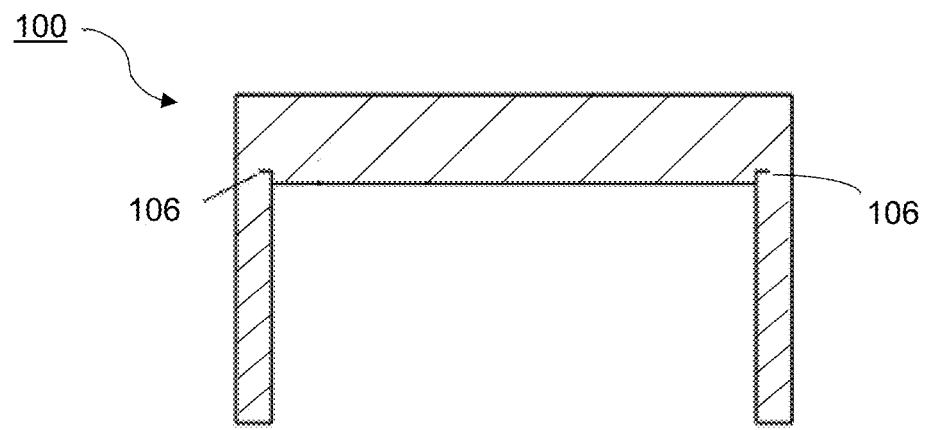
FIG. 1 shows an illustration of a flexibly resilient material 100 according to an embodiment of the invention.
Figure 2:
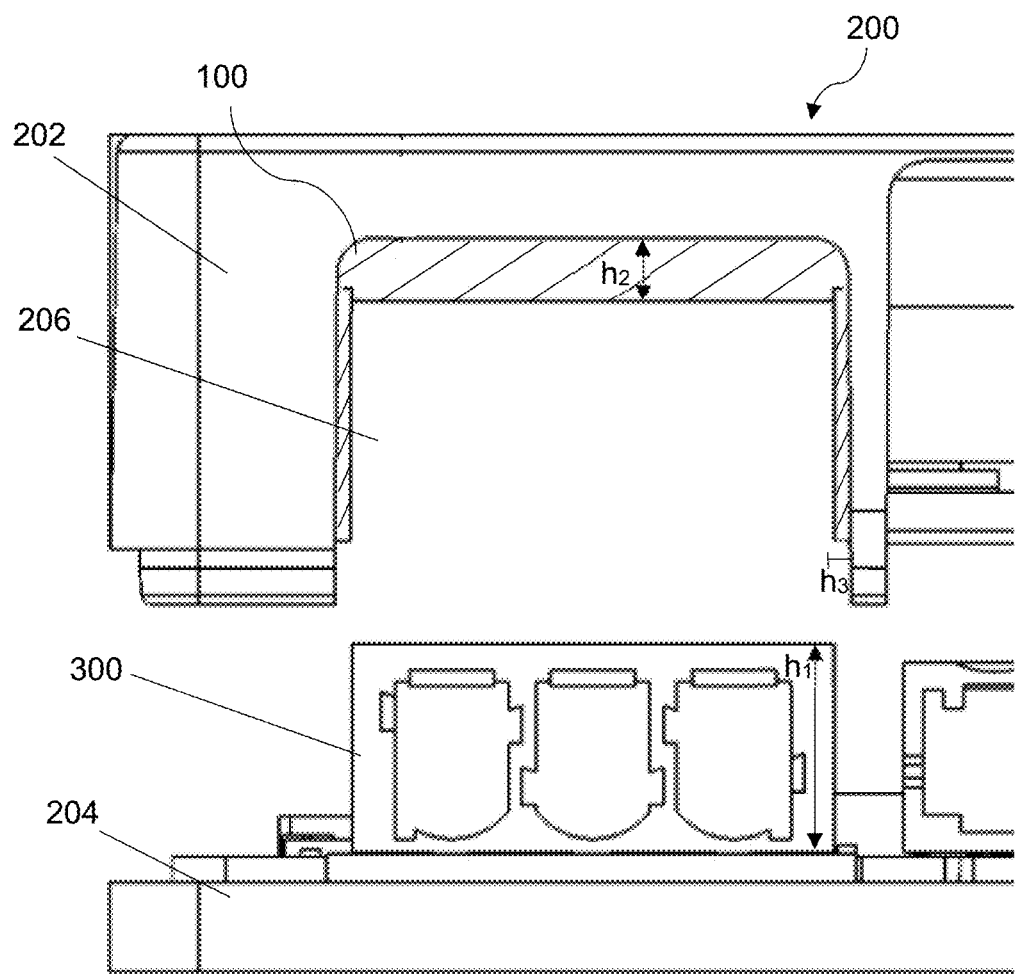
FIG. 2 shows an exploded perspective view of an electronic assembly according to an embodiment of the invention.

FIG. 1 shows an illustration of a flexibly resilient material 100 according to an embodiment of the invention. FIG. 2 shows an exploded perspective view of an electronic assembly according to an embodiment of the invention. As shown in FIG. 2, flexibly resilient material 100 is integrated with housing 200.

The housing 200 may house electronic components (not shown). The housing 200 may be a monolithic housing. The housing 200 may comprise a first housing portion 202 and a second housing portion 204. The first housing portion 202 and the second housing portion 204 may cooperate to enclose the electronic components within. The first housing portion 202 may cooperate with the second housing portion 204 by any suitable means. For example, the first housing portion 202 may be secured to the second housing portion 204 by a catch and/or a lock. The first housing portion 202 may be secured to the second housing portion 204 by one or more fasteners, such as adhesive and/or screws. The first housing portion 202 and the second housing portion 204 may be integrally connected, such as by a hinge. The first housing portion 202 and the second housing portion 204 may be separate pieces that cooperate to enclose the electronic components within.

The second housing portion 204 may be a substrate that supports the electronic components. The housing 200 may comprise a first housing portion 202 and a substrate 204 comprising the input-output port 300 connected to the substrate 204. In such implementations, the first housing portion 202 may comprise side walls and/or a top wall to cooperate with a bottom wall formed by the second housing portion 204 in order to house the electronic components within housing 200.

The second housing portion 204 may support a substrate that in turn supports the electronic components. The substrate may comprise the input-output port 300 connected thereto. In such implementations, the substrate may be connected to, attached to or placed on the second housing portion 204.

The housing 200 comprises an opening 206. The opening 206 may allow for positioning of an input-output port 300 to extend therethrough. The opening 206 may be formed in the first housing portion 202 or the second housing portion 204. The opening 206 may be formed by openings formed in the first housing portion 202 and the second housing portion 204. In such implementation, the openings formed in the first housing portion 202 and the second housing portion 204 may be correspondingly sized to allow the input-output port 300 to extend therethrough. Where the second housing portion 204 or the substrate comprises the input-output port 300, the opening 206 may be formed in the first housing portion 202. The disclosed opening may be suitable for positioning any other component of the electronic assembly that extends outside of the housing. For example, one or more connectors and/or one or more hardware interfaces may extend through the opening.

Due to the provision of the disclosed flexibly resilient material, manufacturing and/or assembling tolerances for the opening 206 may advantageously be relaxed. The opening 206 may be made larger while meeting tolerance calculations.

The flexibly resilient material 100 is arranged to partially cover the opening 206. The opening 206 may be sized to allow input-output port 300 or other components to extend therethrough. The opening 206 may be sized to include tolerances during manufacturing of the electronic assembly and/or assembling of the input-output port 300 with the housing 200. As the opening 206 may be sized to allow input-output port 300 or other components to extend therethrough, the flexibly resilient material 100 may be dimensioned to complement the dimensions of the input-output port 300 or such other components, respectively. The flexibly resilient material 100 may be dimensioned to complement the dimensions of the input-output port 300 or such other components, respectively, and any calculated tolerances. The flexibly resilient material 100 may be dimensioned to cover any space made by the opening 206 that is not taken up by the input-output port 300 when assembled.

The gap between the housing 200 and the input-output port 300 may be more than about 5% of the height of the input-output port 300, or more than about 10% of the height of the input-output port 300, or more than about 15% of the height of the input-output port 300, or more than about 20% of the height of the input-output port 300, or more than about 25% of the height of the input-output port 300, or more than about 30% of the height of the input-output port 300. In an implementation, the gap between the housing 200 and the input-output port 300 ($h_2$ indicated in FIG. 2) may be about 10%, 15%, 20%, 25%, or 30% of the height of the input-output port 300 ($h_1$ indicated in FIG. 2). In an implementation, the gap $h_3$ between the housing 200 and the input-output port 300 may be about 10%, 15%, 20%, 25%, or 30% of the height $h_1$ of the input-output port 300. In an implementation, $h_2$ and $h_3$ may be of same or different dimensions.

The flexibly resilient material 100 may be dimensioned to mirror the dimensions of the gap $h_2$ or $h_3$. The flexibly resilient material 100 may be dimensioned larger than the gap $h_2$ or $h_3$. The flexibly resilient material 100 may have a dimension (width or height) that is similar to or the same as the gap $h_2$ or $h_3$, or may have a dimension (width or height) that is about 1.2 times, 1.4 times, 1.6 times, 1.8 times, or 2 times of the gap $h_2$ or $h_3$. In this implementation, the flexibly resilient material 100 may be designed to cover the gap $h_2$ or $h_3$ as well as part of input-output port 300, thereby increasing resistance to water, dirt and other foreign objects.

The flexibly resilient material 100 may be made of or may comprise any suitable material that allows material 100 to be pliable. Suitable materials include natural or synthetic polymeric materials, such as plastic, for example rubber. The flexibly resilient material 100 may be a film, such as a plastic film. Within the scope of the present disclosure, a polymer may be defined as having a mean molecular weight Mw of 4000 to 40 000 g/mol, where the mean molecular weight Mw is determined by means of gel permeation chromatography (GPC). The solvent for the GPC is preferably ortho-dichlorobenzene at 150° C. with a polystyrene calibration. However, without due experimentation, a person skilled in the art may use other solvents, temperature and/or calibration to arrive at the same GPC results.

The input-output port 300 may extend through a bottom side or a top side of opening 206. In such implementations, the input-output port 300 may be supported by or connected to a substrate or a second housing portion 204. There may be a gap between the housing 200 and all but one side of the input-output port 300. There may be a gap between the first housing portion 202 and/or the second housing portion 204 and all but the supported side(s) of the input-output port 300. In such implementations, the flexibly resilient material 100 may be arranged to extend, where there are gaps, from all but the one side of the opening 206 with no gap. The flexibly resilient material 100 may be arranged to extend from the sides of the opening 206 where there are gaps, to thereby cover the gaps. The flexibly resilient material may be arranged to extend from a top of the opening 206 and sides of the opening 206.

The input-output port 300 may extend through the middle of opening 206, such that there is a gap between the housing 200 and all sides of the input-output port 300. In such implementations, the flexibly resilient material 100 may be arranged to extend from all sides of the opening 206 to thereby cover the gap.

The flexibly resilient material 100 may be dimensioned as disclosed herein. The flexibly resilient material 100 may comprise one or more section(s) or strip(s) that extend from the opening 206 or the side(s) of the opening 206 as disclosed herein. The flexibly resilient material 100 may be a single piece of material. The flexibly resilient material 100 may be punched out, cut out or otherwise removed from a source material in the dimensions disclosed herein. In some implementations, the flexibly resilient material 100 may comprise a top strip connected to side strips.

Where the flexibly resilient material 100 comprises more than one section or strip, a slit 106 may be provided between adjacent sections or strips of the flexibly resilient material 100. For example, a slit 106 may be provided between each side strip and the top strip. Slit 106 may provide additional flexibility for the adjacent sections to flex. The flexibility provided may absorb any misalignment during assembling of the electronic assembly.

Figure 3:
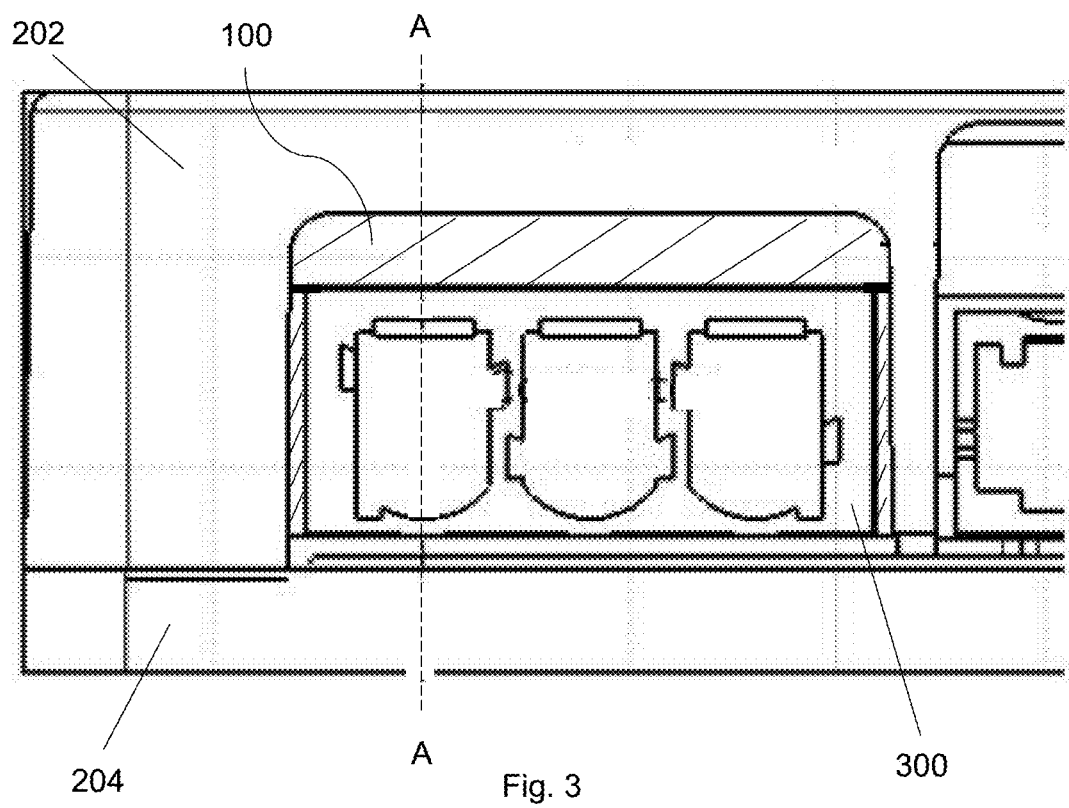
FIG. 3 shows a perspective view of an assembled electronic assembly according to an embodiment of the invention.
Figure 4:
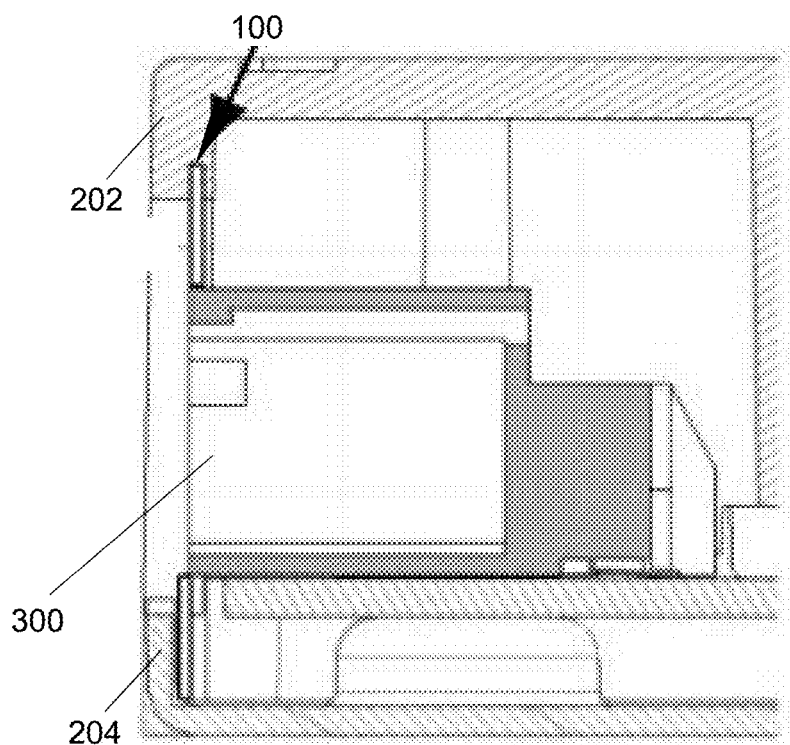
FIG. 4 shows a cross-section side view along axis A-A in FIG. 3.

FIG. 3 shows a perspective view of an assembled electronic assembly according to an embodiment of the invention. FIG. 4 shows a cross-section side view along axis A-A in FIG. 3. The first housing portion 202 is secured to the second housing portion 204 to enclose electronic components within. Once assembled, opening 206 is covered by input-output port 300 and flexibly resilient material 100. Opening 206 is no longer open to water, dirt and other foreign objects.

The disclosed electronic assembly may advantageously satisfy tests to evaluate its resistance to water, dirt and other foreign objects. For example, a functional test for water resistance is to insert a probe of certain diameter into gaps of an electronic assembly. The electronic assembly satisfies the probe test when the probe is unable to be inserted into any part of the electronic assembly. The probe may probe opening 206 and cause flexibly resilient material 100 to flex inward. Gap $h_2$ or $h_3$ may be dimensioned such that an inwardly flexed flexibly resilient material 100 occupies space sufficient enough to prevent the probe from entering. Gap $h_2$ or $h_3$ may advantageously be dimensioned to be larger than the probe, yet still satisfies the probe test.

The electronic assembly may be any electronic device having electronic components housed within a housing. The electronic assembly may comprise one or more input-output ports. If the electronic assembly comprises more than one input-output port, the housing may comprise more than one opening for each input-output port. The electronic assembly may be a computer, a laptop, electronic devices used in a vehicle, or any other consumer electronics.

In an embodiment, there is provided a method of producing an electronic assembly as disclosed herein. The method comprises providing a mold for producing a housing for the electronic assembly. The mold comprises a section to allow an opening to be formed in the housing. The section is sized such that the opening allows an input-output port to extend through the opening. The method further comprises mounting a flexibly resilient material on said section of the mold such that the flexibly resilient material will partially cover said opening once formed. The flexibly resilient material may be one as disclosed herein. In particular, the flexibly resilient material is dimensioned to complement the dimensions of the input-output port. The method further comprises introducing molten material into the mold and solidifying the molten material to produce the housing comprising the flexibly resilient material integrated with the housing. The method further comprises securing the housing with a substrate comprising the input-output port connected thereto to produce the electronic assembly.

The mold may be a mold used for injection molding or any other type of extrusion such as insert molding. As is appreciated by one skilled in the art, the mold may have a shape that is complementary to the desired resulting aspect, such as the housing as disclosed herein. For example, the housing may comprise a first housing portion and a second housing portion. The second housing portion may be a substrate comprising the input-output port connected thereto. The second housing portion may support a substrate comprising the input-output port connected thereto. In implementations where the opening may be formed in the first housing portion and/or the second housing portion, the mold may be configured to form the first housing portion and the second housing portion accordingly.

The mold may comprise a cavity in which the molten material is introduced to form the housing. In order for the resulting housing or first housing portion or second housing portion to comprise an opening, the mold may comprise a section that is complementary in shape to the opening. The mold may comprise a section to allow an opening to be formed in the housing, first housing portion or second housing portion. The section may be sized so that the opening allows for an input-output port to be able to extend therethrough as well as allows for a clearance gap to provide manufacturing and/or assembling tolerances. The disclosed flexibly resilient material may therefore aid in reducing and/or eliminating any such gaps between the housing and the input-output port caused by the opening.

To provide a flexibly resilient material integrated with the housing, the flexibly resilient material may be provided in the mold. The flexibly resilient material may be arranged in the mold such that it will partially cover the opening that will be formed in the housing or first housing portion or second housing portion. The flexibly resilient material may be mounted on the section of the mold that allows an opening to be formed in the housing or first housing portion or second housing portion. The flexibly resilient material may be held in position in the section of the mold that allows an opening to be formed in the housing or first housing portion or second housing portion by any suitable means. For example, the mold may comprise a retention mechanism to fixedly position the flexibly resilient material in the mold or the section of the mold. The retention mechanism may hold the flexibly resilient material such that most of the flexibly resilient material may be protected or obscured from the molten material introduced into the mold. The mold may comprise a retention mechanism that protects or obscures most of the flexibly resilient material from the molten material introduced into the mold, thereby preserving the flexibility of the material in the resulting product. The area of the flexibly resilient material exposed to the molten material may be sufficient enough for fixing the flexibly resilient material to the housing once the molten material solidifies. The area of the flexibly resilient material exposed to the molten material may be permanently attached to the housing once the molten material solidifies.

The molten material introduced into the mold may form the housing. The housing may be made of or may comprise a plastic. In such implementations, the molten material introduced into the mold is or may comprise molten plastic.

The housing comprising the flexibly resilient material integrated with the housing may therefore be produced. In implementations where the opening is formed in a first housing portion, the first housing portion comprising the flexibly resilient material integrated with the first housing portion may be produced. In implementations where the opening is formed by openings formed in a first housing portion and a second housing portion, the first housing portion and second housing portion comprising the flexibly resilient material integrated therewith may be produced.

The housing or the first housing portion produced may be secured with the substrate comprising the input-output port connected thereto. The housing or the first housing portion produced may be secured with the second housing portion that supports the substrate. The step of securing may comprise fastening the housing to the substrate. The step of securing may comprise fastening the first housing portion to the substrate. The step of securing may comprise fastening the first housing portion to the second housing portion that supports the substrate. The housing or first housing portion may be secured to the substrate or second housing portion by one or more fasteners, such as adhesive and/or screws. The electronic assembly may therefore be produced.

The invention claimed is:

1. An electronic assembly comprising:
   a housing for enclosing electronic components within, wherein the housing comprises an opening;
   an input-output port for allowing connection of at least one of the electronic components with at least one input-output device, wherein the input-output port extends through the opening; and
   a flexibly resilient material integrated with the housing and arranged to partially cover the opening, the flexibly resilient material being dimensioned to complement the dimensions of the input-output port.

2. The electronic assembly of claim 1, wherein the flexibly resilient material is dimensioned to cover any space made by the opening that is not taken up by the input-output port.

3. The electronic assembly of claim 2, wherein the flexibly resilient material is arranged to extend from a top of the opening and sides of the opening.

4. The electronic assembly of claim 1, wherein the flexibly resilient material is arranged to extend from a top of the opening and sides of the opening.

5. The electronic assembly of claim 1, wherein the flexibly resilient material comprises a top strip connected to side strips.

6. The electronic assembly of claim 1, wherein a slit is provided between adjacent sections of the flexibly resilient material.

7. The electronic assembly of claim 1, wherein the flexibly resilient material is integrated with the housing by injection molding.

8. The electronic assembly of claim 1, wherein the housing is formed by injection molding.

9. The electronic assembly of claim 1, wherein the flexibly resilient material is a plastic film.

10. The electronic assembly of claim 1, wherein the flexibly resilient material consists of a single piece of flexibly resilient material.

11. The electronic assembly of claim 1, wherein the flexibly resilient material comprises a mean molecular weight $M_w$ of 4000 to 40 000 g/mol.

12. A method of producing an electronic assembly of claim 1, the method comprising:
   providing a mold for producing a housing for the electronic assembly, wherein the mold comprises a section to allow an opening to be formed in the housing, and wherein the section is sized such that the opening allows an input-output port to extend through the opening;
   mounting a flexibly resilient material on said section of the mold such that the flexibly resilient material will partially cover said opening once formed, wherein the flexibly resilient material is dimensioned to complement the dimensions of the input-output port;
   introducing molten material into the mold and solidifying the molten material to produce the housing comprising the flexibly resilient material integrated with the housing; and
   securing the housing with a substrate comprising the input-output port connected thereto to produce the electronic assembly.

* * * * *